US012593550B2

(12) United States Patent
Jin et al.

(10) Patent No.: US 12,593,550 B2
(45) Date of Patent: Mar. 31, 2026

(54) DISPLAY APPARATUS AND MANUFACTURING METHOD THEREOF

(71) Applicant: SILICON DISPLAY TECHNOLOGY, Yongin-si (KR)

(72) Inventors: Jong Woo Jin, Seoul (KR); Jinhyeong Yu, Yongin-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 537 days.

(21) Appl. No.: 17/994,075

(22) Filed: Nov. 25, 2022

(65) Prior Publication Data

US 2023/0207760 A1 Jun. 29, 2023

(30) Foreign Application Priority Data

Dec. 27, 2021 (KR) ........................ 10-2021-0188741

(51) Int. Cl.
| | |
|---|---|
| *H10H 20/857* | (2025.01) |
| *H01L 25/075* | (2006.01) |
| *H10H 20/01* | (2025.01) |
| *H10H 20/814* | (2025.01) |
| *H10H 20/824* | (2025.01) |
(Continued)

(52) U.S. Cl.
CPC ....... *H10H 20/857* (2025.01); *H01L 25/0753* (2013.01); *H10H 20/013* (2025.01); *H10H 20/814* (2025.01); *H10H 20/824* (2025.01); *H10H 20/8312* (2025.01); *H10H 20/833* (2025.01); *H10H 20/032* (2025.01); *H10H 20/0364* (2025.01)

(58) Field of Classification Search
CPC .. H10H 20/857; H10H 20/013; H10H 20/814; H10H 20/00–882; H10H 29/00–142; H10H 29/30–962; H01L 25/0753; H10D 30/6732; H10D 30/6734
See application file for complete search history.

(56) References Cited

U.S. PATENT DOCUMENTS

| | | |
|---|---|---|
| 2014/0299837 A1 | 10/2014 | Bibl et al. |
| 2015/0221778 A1 | 8/2015 | Miyairi et al. |
| | (Continued) | |

FOREIGN PATENT DOCUMENTS

| | | |
|---|---|---|
| KR | 10-1524726 | 6/2015 |
| KR | 10-2021-0108345 | 9/2021 |

*Primary Examiner* — Shahed Ahmed
(74) *Attorney, Agent, or Firm* — LEX IP MEISTER, PLLC

(57) ABSTRACT

A display device according to an embodiment includes a substrate including a plurality of first pads for transmitting a gate signal, a plurality of second pad for transmitting a data signal, a plurality of third pads for transmitting a first power voltage, and a plurality of fourth pads for transmitting a second power voltage different from the first power voltage, into a display area; and a plurality of display modules each including first to fourth connection electrodes attached to the first to the fourth pads, respectively, a first transistor electrically connected to the third connection electrode and having an activation layer including a oxide semiconductor, a second transistor electrically connected to the first connection electrode and the second connection electrode, and a light emitting diode electrically connected to the first transistor and the fourth connection electrode.

10 Claims, 9 Drawing Sheets

(51) Int. Cl.
 *H10H 20/831* (2025.01)
 *H10H 20/833* (2025.01)

(56) References Cited

U.S. PATENT DOCUMENTS

2020/0203462 A1 * 6/2020 Oh ......................... H10K 59/40
2020/0234647 A1 * 7/2020 Lin ...................... G09G 3/3266

\* cited by examiner

DISPLAY APPARATUS AND MANUFACTURING METHOD THEREOF

CROSS-REFERENCE TO RELATED APPLICATION

This application claims priority to and the benefit of Korean Patent Application No. 10-2021-0188741 filed in the Korean Intellectual Property Office on Dec. 27, 2021, the entire contents of which are incorporated herein by reference.

BACKGROUND

1. Field

An embodiment relates to a display device and a manufacturing method of a display device.

2. Description of the Related Art

A thin film transistor is used as a switching element in a display device such as a liquid crystal display device or an organic light emitting display device. The mobility or leakage current of the thin film transistor largely depends on a material and state of a channel layer, which is a path through which carriers move.

Compared to a general-purpose amorphous silicon (a-Si), an amorphous oxide semiconductor has high carrier mobility, has a large optical band gap, and may be formed into a film at low temperature. Therefore, it is expected to be applied to next-generation displays that require large-size, high-resolution, and high-speed operation, transparent displays that require high transmittance, and resin substrates with low heat resistance.

SUMMARY

The embodiment is to provide a display device that is robust to coupling or leakage current by external voltage.

A display device according to an embodiment includes a substrate including a plurality of first pads for transmitting a gate signal, a plurality of second pad for transmitting a data signal, a plurality of third pads for transmitting a first power voltage, and a plurality of fourth pads for transmitting a second power voltage different from the first power voltage, into a display area; and a plurality of display modules each including first to fourth connection electrodes attached to the first to the fourth pads, respectively, a first transistor electrically connected to the third connection electrode and having an activation layer including a oxide semiconductor, a second transistor electrically connected to the first connection electrode and the second connection electrode, and a light emitting diode electrically connected to the first transistor and the fourth connection electrode.

The first transistor may include one terminal and a first gate that are connected to an anode of the light emitting diode, a second gate connected to the second transistor, and the other terminal connected to the third connection electrode.

The substrate may further include a plurality of gate lines and a plurality of second power voltage line extending in a first direction and arranged along a second direction crossing the first direction, and a plurality of data lines and a plurality of first power voltage lines extending in the second direction and arranged along the first direction, and a plurality of first pads may be connected to a plurality of gate lines, a plurality of second pads is connected to a plurality of data lines, a plurality of third pads may be connected to a plurality of first power voltage lines, and a plurality of fourth pads may be connected to a plurality of second power voltage lines.

A plurality of gate lines and a plurality of second power voltage lines, and a plurality of data lines and a plurality of first power voltage lines may be positioned on different layers from each other.

Each of a plurality of display modules may include a substrate, a first conductive semiconductor layer on the substrate, a first activation layer on the first conductive semiconductor layer, a second conductive semiconductor layer on the first activation layer, a reflective layer on the second conductive semiconductor layer, a first protection layer covering the reflective layer, and a display element including one terminal connected to the first conductive semiconductor layer on the first protection layer and the other terminal connected to the reflective layer on the protection layer, the light emitting diode includes the first conductive semiconductor layer, the first activation layer, and the second conductive semiconductor layer, and may further include a transistor including a first gate electrode on the first protection layer, a gate insulating layer on the first gate electrode, a second activation layer on the gate insulating layer, a source electrode and a drain electrode on the second activation layer, a second protection layer covering the source electrode and the drain electrode, and a second gate electrode on the second protection layer, the first connection electrode may be connected to the one terminal, the second connection electrode may be connected to the drain electrode, and the other terminal may be connected to the source electrode.

A display device according to another embodiment includes a substrate including a plurality of first pads for transmitting a gate signal, a plurality of second pads for transmitting a light emitting control signal, a plurality of third pad for transmitting a data signal, a plurality of fourth pads for transmitting an initialization voltage, a plurality of fifth pads for transmitting a first power voltage, and a plurality of sixth pads for transmitting a second power voltage different from the first power voltage, into a display area; and a plurality of display module respectively including first/first and first/second connection electrode respectively attached to first/first pad and first/second pad among a plurality of first pads, second to sixth connection electrodes respectively attached to the second pad to the sixth pad, a capacitor electrically connected between the fifth connection electrode and a first node, a first transistor outputting a driving current based on a voltage of both terminals of the capacitor, a second transistor transmitting an initialization voltage to the gate of the first transistor and having an activation layer including an oxide semiconductor, and a light emitting diode emitting light by the driving current.

The second transistor may include one terminal connected to the gate of the first transistor, a first gate electrically connected to the first/first connection electrode, and the other terminal and a second gate electrically connected to the fourth pad.

Each of a plurality of display modules may further include a third transistor transmitting an initialization voltage to an anode of the light emitting diode and having an activation layer including an oxide semiconductor.

The third transistor may include one terminal connected to the anode of the light emitting diode, a first gate electrically connected to the first/first connection electrode, and the other terminal and a second gate electrically connected to the fourth pad.

Each of a plurality of display modules may further include a fourth transistor including an activation layer connected between the gate and one terminal of the first transistor including an oxide semiconductor, a first gate electrically connected to the first/second connection electrode, and a second gate electrically connected to the gate of the first transistor.

A display device according to another embodiment includes a display element including a substrate, a first conductive semiconductor layer on the substrate, a first activation layer on the first conductive semiconductor layer, a second conductive semiconductor layer on the first activation layer, a reflective layer on the second conductive semiconductor layer, a first protection layer covering the reflective layer, and one terminal connected to the first conductive semiconductor layer on the first protection layer and the other terminal connected to the reflective layer on the protection layer; a transistor including a first gate electrode on the first protection layer, a gate insulating layer on the first gate electrode, a second activation layer including an oxide semiconductor on the gate insulating layer, a source electrode and a drain electrode on the second activation layer, a second protection layer covering the source electrode and the drain electrode, and a second gate electrode on the second protection layer; and a first connection electrode connected to one terminal and a second connection electrode connected to the drain electrode, wherein the other terminal may be connected to the source electrode.

The first gate electrode or the second gate electrode may be connected to the source electrode.

The first conductive semiconductor layer and the second conductive semiconductor layer may be formed of III-V Group material.

The first activation layer may be composed of III-V Group material,

At least at least one electrode of the one terminal, the other terminal, the first gate electrode, the source electrode, the drain electrode, the second gate electrode, the first connection electrode, and the second connection electrode may include at least one transparent material of ITO (Indium Tin Oxide), IZO (Indium Zinc Oxide), Ag nanowire.

A manufacturing method of a display device according to an embodiment includes forming a first conductive semiconductor layer on a substrate; forming a first activation layer on the first conductive semiconductor layer; forming a second conductive semiconductor layer on the first activation layer; forming a reflective layer on the second conductive semiconductor layer to form a light emitting diode; forming a first protection layer covering the reflective layer; forming one terminal connected to the first conductive semiconductor layer and the other terminal and a first gate electrode connected to the reflective layer on the first protection layer; forming a gate insulating layer on the first gate electrode; forming a second activation layer including an oxide semiconductor on the gate insulating layer; forming a drain electrode and a source electrode connected to the other terminal on the second activation layer; forming a second protection layer covering the source electrode and the drain electrode; forming a second gate electrode on the second protection layer to form a transistor; forming a third protection layer on the second gate electrode; forming a first connection electrode connected to one terminal and a second connection electrode connected to the drain electrode on the third protection layer; cutting the substrate on which the light emitting diode and the transistor are formed into a plurality of display modules; and attaching the display module to the substrate including a plurality of pads to which a signal used for the light emitting diode to emit light is applied, wherein the first gate electrode or the second gate electrode may be connected to the source electrode.

The effect of the display device and the manufacturing method of the display device according to the embodiment will be described as follows.

According to at least one of the embodiments, there is a merit that the display device with an excellent display quality may be provided.

Also, according to at least one of the embodiments, there is a merit that may provide a high-resolution display device with low power consumption.

DETAILED DESCRIPTION

Figure 1:
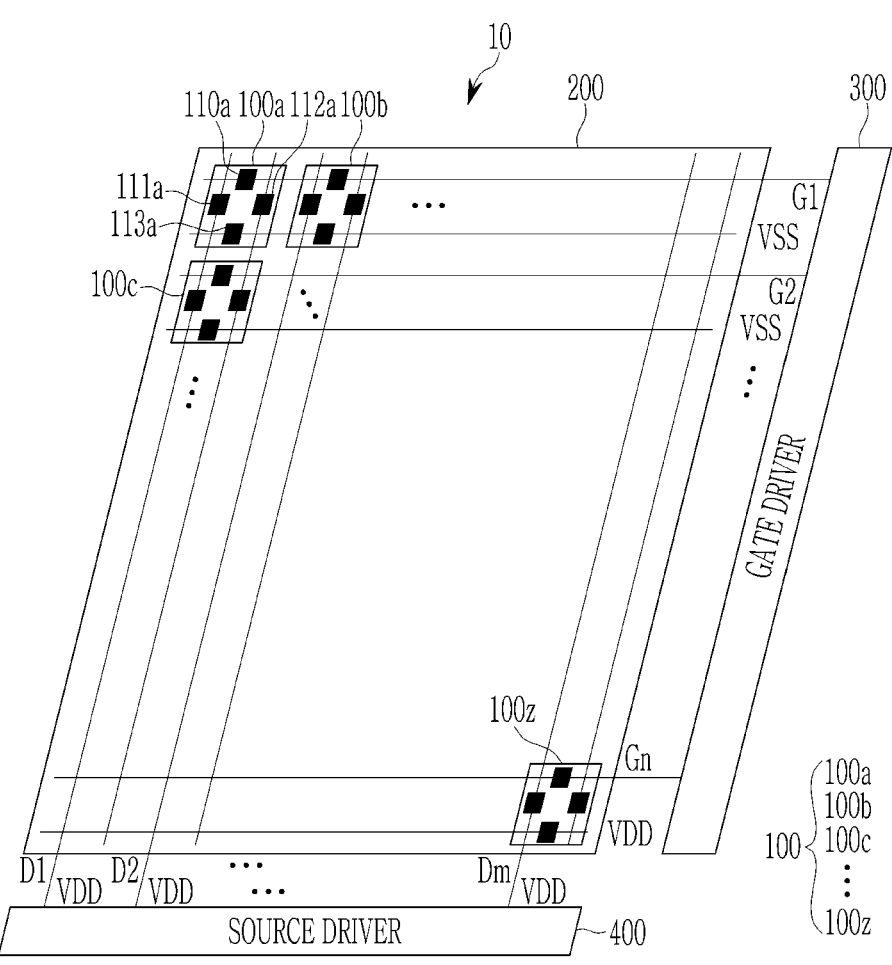
FIG. 1 is a block diagram schematically showing a display device according to an embodiment.

Hereinafter, exemplary embodiments will be described with reference to accompanying drawings so as to be easily understood by a person ordinary skilled in the art. As those skilled in the art would realize, the described embodiments may be modified in various different ways, all without departing from the spirit or scope of the present invention.

Further, the size and thickness of each of elements that are displayed in the drawings are described for better understanding and ease of description, and the present invention is not limited by the described size and thickness.

In the drawings, the thickness of layers, films, panels, regions, etc., are exaggerated for clarity. In addition, in the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise", and variations such as "comprises" or "comprising", will be understood to imply the inclusion of stated elements but not the exclusion of any other elements. Further, in the specification, the word "~on" means positioning above or below the object portion, but does not essentially mean positioning on the upper side of the object portion based on a gravity direction.

Hereinafter, a display device according to an embodiment is described with reference to FIG. 1.

FIG. 1 is a block diagram schematically showing a display device according to an embodiment. As shown in FIG. 1, a display device 10 includes a plurality of display modules 100*a*, 100*b*, 100*c*, . . . , 100*z*, a substrate 200 where a plurality of display modules 100*a*, 100*b*, 100*c*, . . . , 100*z* is positioned, and a driving unit 300 and 400 of providing signals corresponding to a plurality of display modules 100*a*, 100*b*, 100*c*, . . . , 100*z*.

Each display module 100 includes a display element that emits light according to a signal from the driving units 300 and 400. One display module 100 may have one or a plurality of display elements emitting light of one color wavelength.

The signals from the driving units 300 and 400 may be transmitted to each display module 100 through a plurality of connection electrodes 110*a*, 111*a*, 112*a*, 113*a* of each display module 100. A plurality of connection electrodes 110*a*, 111*a*, 112*a*, and 113*a* are electrically connected to a connection pad on the substrate 200.

The number of a plurality of connection electrodes 110*a*, 111*a*, 112*a*, and 113*a* is different according to the number of the display elements included in each display module 100. For example, when four types of signals (e.g., a gate signal, a data signal, a first power voltage, and a second power voltage) are applied to one display element, the display module 100 having one display element may have four connection electrodes, and the display module 100 having four display elements may have 16 connection electrodes. A plurality of connection electrodes 110*a*, 111*a*, 112*a*, and 113*a* may be formed of a transparent material.

In the case of the display module 100 having a plurality of display elements, a common connection electrode for receiving a signal commonly applied to each display element may be included. For example, the display module 100 having four display elements in a 1×4 form may have seven connection electrodes (four data signal connection electrodes, one gate signal connection electrode, one first power voltage connection electrode, and one second power voltage connection electrode).

The substrate 200 includes a plurality of signal lines. For example, the substrate 200 includes a plurality of gate lines G1, G2, . . . , Gn and a plurality of data lines D1, D2, . . . , Dm. In addition, the substrate 200 includes a power voltage line VDD, VSS that provides a power voltage. A plurality of signal lines may be positioned on the substrate 200 in different layers or on the same layer.

A plurality of data lines D1, D2, . . . , Dm extend approximately in the column direction and are substantially parallel to each other. A plurality of gate lines G1, G2, . . . , Gn extend approximately in the row direction and are substantially parallel to each other.

The connection pad on the substrate 200 may be positioned on the surface of the substrate 100. The arrangement shape of the connection pads connected to one display element on the substrate 200 is the same. The connection pad on the substrate 200 is electrically connected to a plurality of signal lines.

The gate driving unit 300 is connected to each display module 100 through a plurality of gate lines G1, G2, . . . , Gn. The gate driving unit 300 generates a plurality of gate signals according to the control signal and transmits them to a corresponding gate line among a plurality of gate lines.

The source driving unit 400 is connected to each display module 100 through a plurality of data lines D1, D2, . . . , Dm. The source driving unit 400 receives an image data signal, a control signal, and the like, and transmits a data signal to the corresponding data line among a plurality of data lines D1, D2, . . . , Dm. The source driving unit 400 selects a grayscale voltage according to the image data signal and transmits it to a plurality of data lines as a data signal.

The source driving unit 400 samples and holds the image data signal, and transmits a plurality of data signals to each of a plurality of data lines D1, D2, . . . , Dm. For example, the source driving unit 400 may apply a data signal having a predetermined voltage range to a plurality of data lines D1, D2, . . . , Dm in response to the gate signal of an enable level.

In addition, the gate driving unit 300 and/or the source driving unit 400 may apply a first power voltage and a second power voltage to the power voltage lines VDD and VSS. The first power voltage applied to the power voltage line VDD and the second power voltage applied to the power voltage line VSS may have different values.

The substrate 200, the signal lines G1, G2, . . . , Gn, D1, D2, . . . , Dm, VDD, VSS, and the pads 110*a*, 111*a*, 112*a*, 113*a* on the substrate are formed of a transparent material, and the transparent electrode is formed also in the display module 100, thereby the display device 10 having high transmittance may be implemented.

On the other hand, when the substrate 200 has stretchable, flexible, bendable, and foldable properties, a curved display with high transmittance may be realized by mounting the display module 100 on the substrate 200. Alternatively, by attaching the substrate 200 to a curved glass substrate or the like curved in a specific shape after mounting the display module 100 on the substrate 200, a curved display with high transmittance may be realized. This curved display may be used as a front glass, rear glass, side mirror of a vehicle, glass of a building, or a mirror.

Next, the display element included in the display module 100 will be described with reference to FIG. 2.

Figure 2:
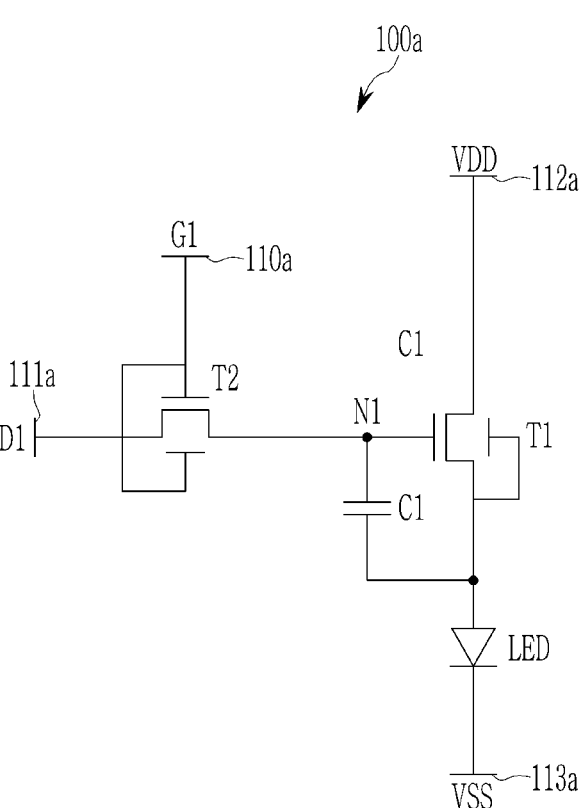
FIG. 2 is a circuit diagram showing an example of a display element of a display device according to an embodiment.

FIG. 2 is a circuit diagram showing an example of a display element of a display device according to an embodiment. The display module 100*a* will be described as an example.

Referring to FIG. 2, the display element includes a first transistor T1, a second transistor T2, a storage capacitor C1, and a light emitting diode LED.

The gate of the first transistor T1 is connected to one electrode of the storage capacitor C1 at the first node N1, one terminal of the first transistor T1 is connected to the power voltage line VDD for supplying the first power voltage through the connection electrode 112*a*, and the other terminal of the first transistor T1 is electrically connected to the anode of the light emitting diode LED. The first transistor T1 receives the data signal according to the switching operation of the second transistor T2 and supplies the driving current to the light emitting diode LED.

The gate of the second transistor T2 is connected to the first gate line G1 through the connection electrode 110*a*, one terminal of the second transistor T2 is connected to the data line D1 through the connection electrode 111*a*, and the other terminal of the second transistor T2 is connected to the gate of the first transistor T1 at the first node N1.

The second transistor T2 is turned on according to the gate signal transmitted through the gate line G1 and performs a switching operation of transmitting the data signal transmitted to the data line D1 to the first node N1.

The first and second transistors T1 and T2 may be n-type transistors. Also, the first and second transistors T1 and T2 may be a double gate transistor. The double gate transistor is a transistor including an activation layer where a channel region is formed, a first gate electrode including at least a part overlapping the activation layer, a second gate electrode including at least a part overlapping the activation layer, and a source and a drain electrode connected to a source and drain region connected to the activation layer.

According to an example, the first gate electrode may at least partially overlap the channel region of the activation layer above the activation layer, and the second gate electrode may at least partially overlap the channel region of the activation layer below the activation layer. According to another example, the first gate electrode may at least partially overlap the channel region of the activation layer under the activation layer, and the second gate electrode may at least partially overlap the channel region of the activation layer above the activation layer.

The first transistor T1 may include a first gate electrode connected to the first node N1 and a second gate electrode connected to the anode of the light emitting diode LED. Since the second node N2 is connected to the source electrode of the first transistor T1, the first transistor T1 may be referred to as a source sink double gate transistor.

The second transistor T2 may include a first gate electrode and a second gate electrode directly connected to each other. The second transistor T2 may be referred to as a gate sink double gate transistor.

Since the first and second transistors T1 and T2 have a double gate transistor structure, an element reliability may be increased.

Each activation layer of the first and second transistors T1 and T2 may include an oxide semiconductor. The oxide semiconductor transistor may be processed at low temperatures and have low charge mobility compared to a polysilicon transistor. Such an oxide semiconductor transistor has excellent off-current characteristics.

The oxide semiconductor material as a metal oxide semiconductor may be made of an oxide of a metal such as zinc (Zn), indium (In), gallium (Ga), tin (Sn), and titanium (Ti), or a combination of the metal such as zinc (Zn), indium (In), gallium (Ga), tin (Sn), titanium (Ti), and the oxide thereof. For example, the oxide semiconductor may include one of zinc oxide (ZnO), indium-gallium-zinc oxide (In—Ga—Zn—O), indium-zinc oxide (In—Zn—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), hafnium-indium-zinc oxide (Hf—In—Zn—O), which is an oxide based on titanium (Ti), hafnium (Hf), zirconium (Zr), aluminum (Al), tantalum (Ta), germanium (Ge), zinc (Zn), gallium (Ga), tin (Sn), or indium (In), or composite oxides thereof.

The other electrode of the storage capacitor C1 is connected to the anode of the light emitting diode LED.

The cathode of the light emitting diode LED is connected to the power voltage line VSS through the connection electrode 113a. The light emitting diode LED receives the driving current from the first transistor T1 and emits light.

Next, the substrate 200 on which the display module 100 is disposed will be described with reference to FIG. 3.

Figure 3:
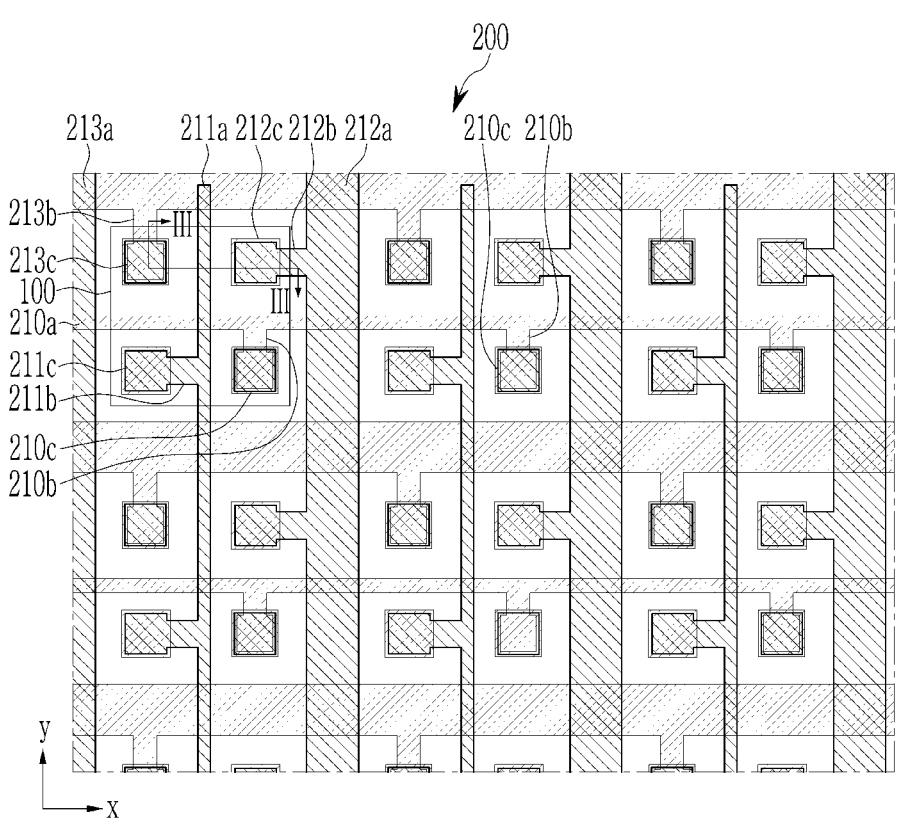
FIG. 3 is a top plan view showing a substrate of a display device according to an embodiment.

FIG. 3 is a top plan view showing a substrate of a display device according to an embodiment.

On the substrate 200, the gate line 210 and the power voltage line 213 extending along a first direction (an x-axis direction) are arranged along a second direction (a y-axis direction), and the data line 211 and the power voltage line 212 extending along the second direction (the y-axis direction) are arranged along the first direction (the x-axis direction).

The gate line 210 and the power voltage line 213 may be positioned on a different layer than the data line 211 and the power voltage line 212.

The arrangement shape of the pads 210c, 211c, 212c, and 213c corresponding to one display element may be the same on the substrate 200. Each of the pads 210c, 211c, 212c, and 213c is connected to a corresponding signal line among a plurality of signal lines 210a, 211a, 212a, 213a through a corresponding one of the connection wiring 210b, 211b, 212b, 213b.

Next, the structure of the display device will be described with reference to FIG. 4.

Figure 4:
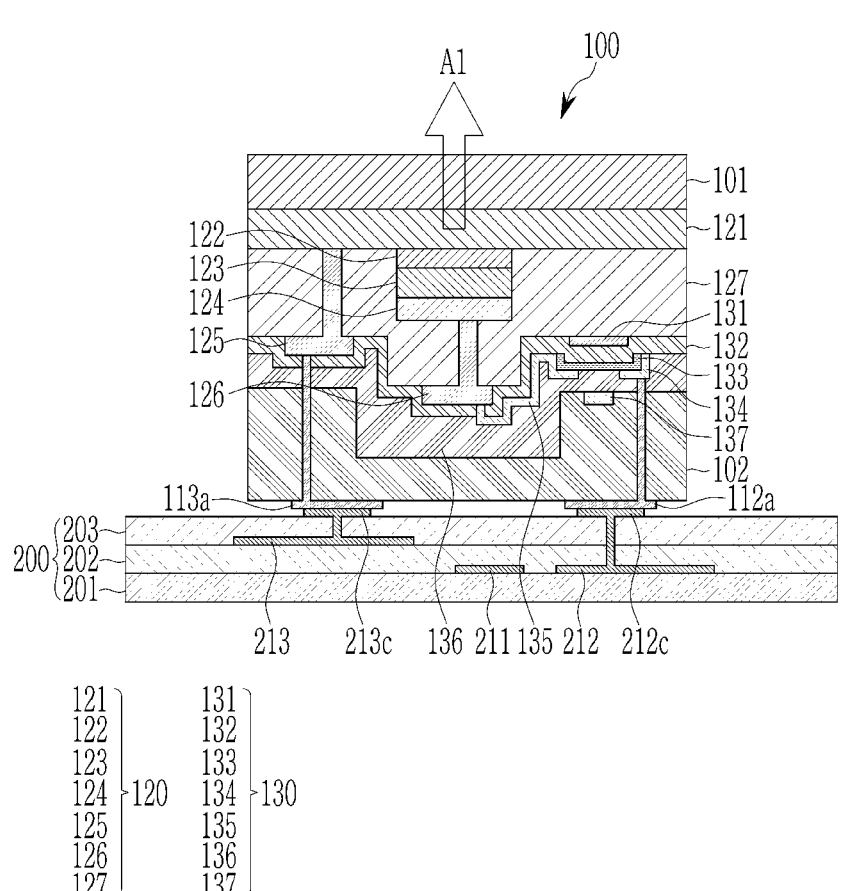
FIG. 4 is a cross-sectional view of a partial area of a display device where a display module is bonded to a substrate of FIG. 3.

FIG. 4 is a cross-sectional view of a partial area of a display device where a display module is bonded to a substrate of FIG. 3.

Referring to FIG. 4, the display module 100 is positioned on the substrate 200. The connection electrodes 112a and 113a of the display module 100 are electrically connected to the pads 212c and 213c of the substrate 200.

The display element 120 may be positioned on the module substrate 101. In this case, the module substrate 101 may be selected from the group consisting of sapphire, silicon carbide, zinc oxide, gallium nitride, aluminum nitride, zirconium diboride, gallium arsenide, and silicon, but is not limited thereto.

Specifically, in addition to sapphire, other heterogeneous substrates such as glass, silicon carbide, silicon, GaAs, GaP, AlGaINP, Ge, SiSe, GaN, AlInGaN, InGaN, etc. may be used.

A transistor 130 is positioned on the module substrate 101. The display element 120 is connected to the transistor 130 (the first transistor T1 of FIG. 2). For example, the electrode 126 of the display element 120 is interconnected with the electrode 135 of the transistor 130.

The transistor 130 according to an embodiment may be configured in any one structure of a coplanar, a staggered, an inverted coplanar, and an inverted stagger.

The display element 120 includes a first conductive semiconductor layer 121, a first electrode 125, a first activation layer 122, a second conductive semiconductor layer 123, a second electrode 126, and a first protection layer 127.

More specifically, the first conductive semiconductor layer 121 is positioned on the module substrate 101. The first activation layer 122 is positioned on the first conductive semiconductor layer 121, and the second conductive semiconductor layer 123 is positioned on the first activation layer 122.

In this case, the first activation layer 122 may have a quantum well structure, such as GaN, InGaN, AlGaN, GaP, AlGaInP, AlInP, InP, GaAs, InGaAs, and AlGaAs, and may be formed of a III-V group material.

The first conductive semiconductor layer 121 and the second conductive semiconductor layer 123 may include a p-GaN-based semiconductor material or an n-GaN-based semiconductor material, but the materials of the first activation layer 122 and the semiconductor layers 121 and 123 are not limited thereto. The n-GaN-based semiconductor material may include a III-V group material, such as GaN, n-GaN, n-InGaN, n-AlGaN, n-GaP, n-AlGaInP, n-AlInP, n-InP, n-GaAs, n-InGaAs, and n-AlGaAs. When the first conductive semiconductor layer 121 includes an n-GaN-based semiconductor material, impurities used for doping the first conductive semiconductor layer 121 include Si, Ge, Se, Te, or C. The p-GaN-based semiconductor material may include an III-V group material, such as GaN, p-GaN, p-InGaN, p-AlGaN, p-GaP, p-AlGaInP, p-AlInP, p-InP, p-GaAs, p-InGaAs, and p-AlGaAs. Herein when the second conductive semiconductor layer 123 includes the p-GaN-based semiconductor material, impurities used for doping the second conductive semiconductor layer 123 includes Mg, Zn, or Be.

A reflective layer 124 is located on the second conductive semiconductor layer 123. Therefore, the display module 100 emits light in a direction A1.

A first protection layer 127 is positioned on the reflective layer 124. The first electrode 125 is connected to the first conductive semiconductor layer 121 through a contact hole, and the second electrode 126 is connected to the reflective layer 124 through a contact hole. The first electrode 125 and the second electrode 126 may include a transparent material including at least one of indium tin oxide (ITO), indium zinc oxide (IZO), and Ag nanowire.

Meanwhile, the transistor 130 is configured including a first gate electrode 131, a gate insulating layer 132, a second activation layer 133, a source electrode 134, a drain electrode 135, a second protection layer 136, and a second gate electrode 137. The transistor 130 is a dual gate transistor and may reduce a leakage current flowing through the transistor 130.

Specifically, the first gate electrode 131 is positioned on the first protection layer 127. The gate insulating layer 132 is positioned on the first gate electrode 131, the second activation layer 133 is positioned on the gate insulating layer 132, and the drain electrode 135 and the source electrode 134 are positioned on the second activation layer 133. The first gate electrode 131, the drain electrode 135, and the source electrode 134 may be formed of a transparent material including at least one of ITO, IZO, and Ag nanowire.

The second activation layer 133 may include at least one of amorphous silicon, polycrystalline silicon, and oxide semiconductor.

In addition, the second electrode 126 of the display element 120 and the drain electrode 135 of the transistor 130 are electrically connected, and may be formed of the same material.

A second protection layer 136 is positioned on the second activation layer 133, the source electrode 134, and the drain electrode 135, and a second gate electrode 137 is positioned on the second protection layer 136. The second gate electrode 137 may be formed of a transparent material including at least one of ITO, IZO, and Ag nanowire.

A third protection layer 102 may be formed on the transistor 130 configured as described above to protect the transistor 130.

On the third protection layer 102, a connection electrode 113a and a connection electrode 112a are positioned. The connection electrode 113a is connected to the first electrode 125 through a contact hole, and the connection electrode 112a is connected to the source electrode 134 of the transistor 130 through a contact hole. The connection electrodes 112a and 113a may be formed of a transparent material including at least one of ITO, IZO, and Ag nanowire.

The substrate 200 includes a first substrate layer 201, a data line 211 and a power voltage line 212 positioned on the first substrate layer 201, a second substrate layer 202 positioned on the data line 211 and the power voltage line 212, a gate line (not shown) and a power voltage line 213 positioned on the second substrate layer 202, a third substrate layer 203 positioned on the gate line (not shown) and the power voltage line 213, and pads 212c and 213c positioned on the third substrate layer 203 and connected to a corresponding signal line through a contact hole.

Next, a method for manufacturing the display module 100 is described with reference to FIG. 5 to FIG. 7.

Figure 5:
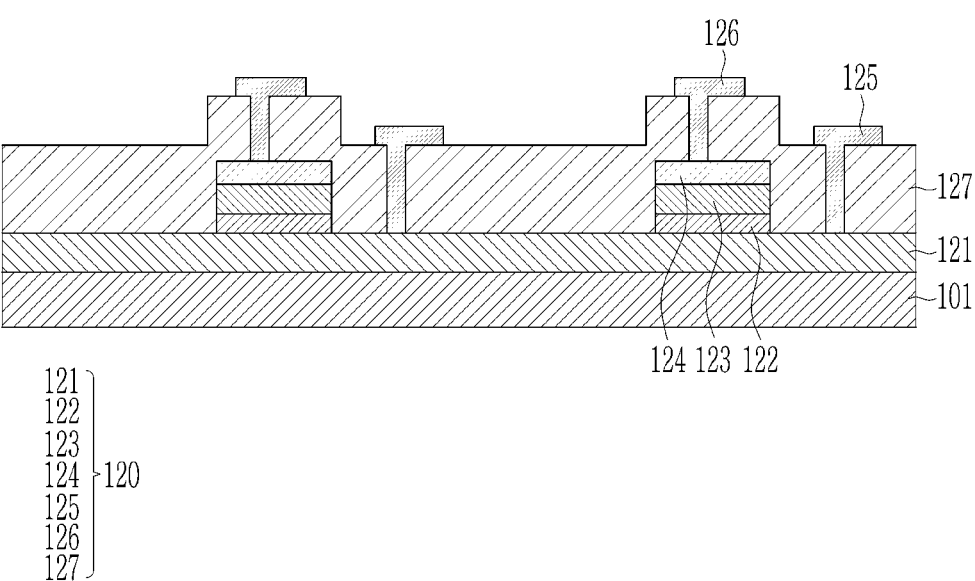
FIG. 5 to FIG. 7 are cross-sectional views of a display module manufactured according to a method of manufacturing a display device according to an embodiment.
Figure 6:
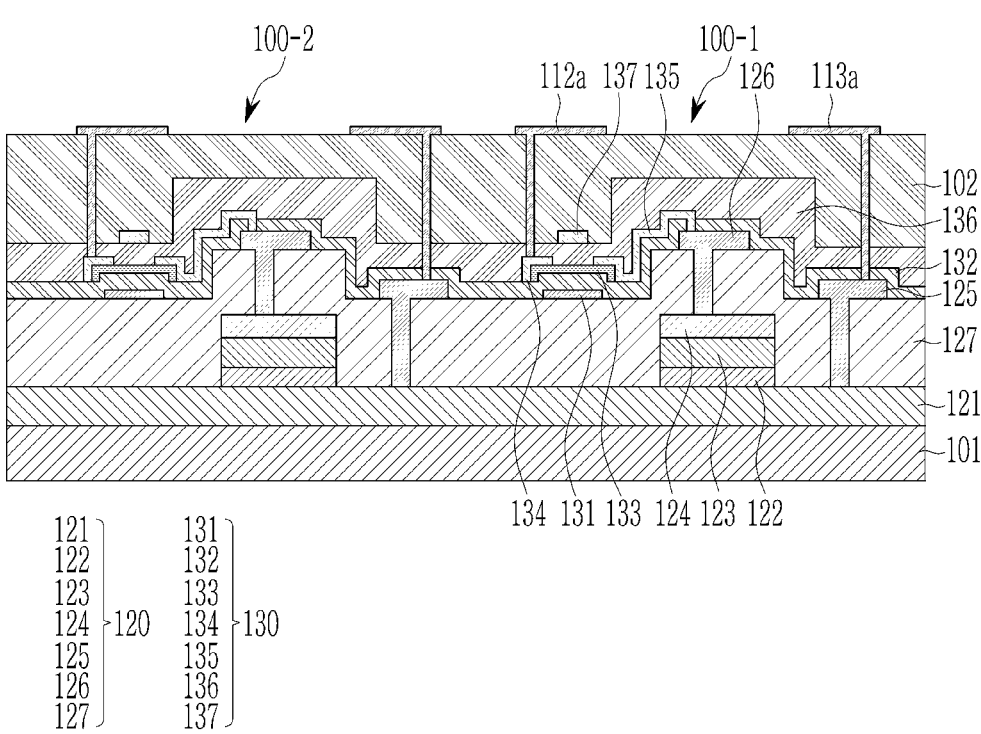
Figure 7:
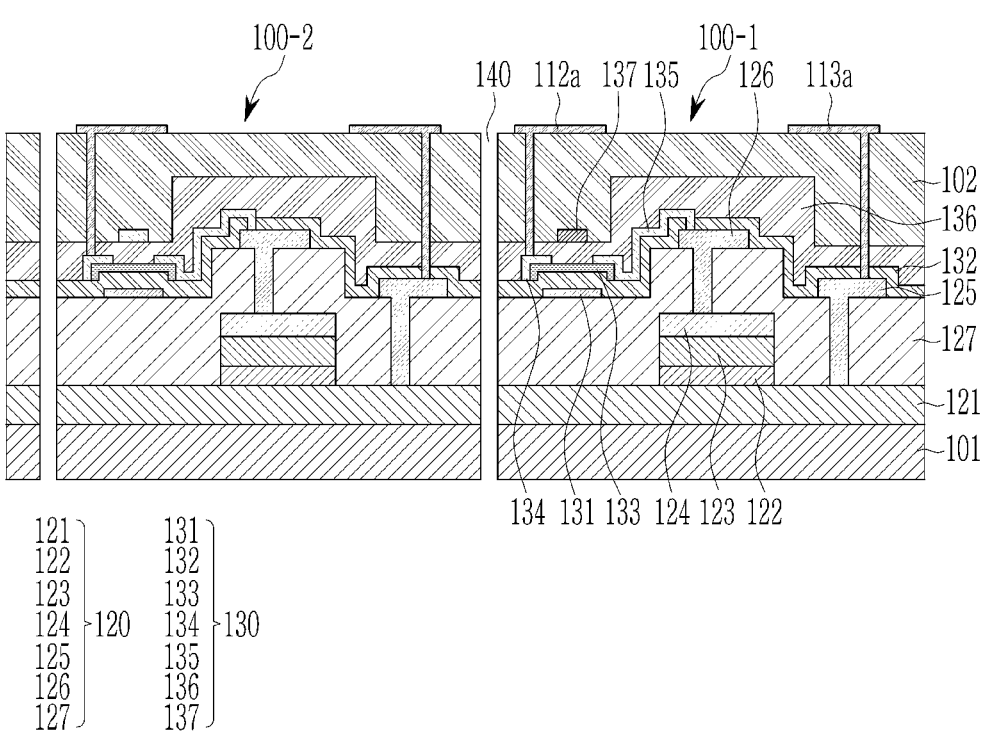

FIG. 5 to FIG. 7 are cross-sectional views of a display module manufactured according to a method of manufacturing a display device according to an embodiment.

As shown in FIG. 5, on a module substrate 101, a first conductive semiconductor layer 121, a first activation layer 122, a second conductive semiconductor layer 123, and a reflective layer 124 are formed.

A first protection layer 127 is formed on the first conductive semiconductor layer 121, the first activation layer 122, the second conductive semiconductor layer 123, and the reflective layer 124.

Also, a first electrode 125 and a second electrode 126 are formed on the first protection layer 127. The first electrode 125 is connected to the first conductive semiconductor layer 121 through a contact hole. The second electrode 126 is connected to the reflective layer 124 through a contact hole.

Next, as shown in FIG. 6, a transistor 130 is formed on the display element 120.

A first gate electrode 131 is formed on the first protection layer 127. The first gate electrode 131 may be formed together with the first electrode 125 and the second electrode 126. A gate insulating layer 132 is formed on the first gate electrode 131, the first electrode 125, and the second electrode 126.

A second activation layer 133 is formed on the gate insulating layer 132, and a drain electrode 135 and a source electrode 134 are formed in the drain area and the source area of the second activation layer 133, respectively. The drain electrode 135 of the transistor 130 is connected to the second electrode 126 of the display element 120 through a contact hole.

A second protection layer 136 is formed on the second activation layer 133, the source electrode 134, and the drain electrode 135. A second gate electrode 137 is formed on the second protection layer 136.

A third protection layer 102 is formed on the second protection layer 136 and the second gate electrode 137. The first to third protection layers 127, 136, and 102 may be formed of a single layer or a multilayer of silicon oxide (SiOx) or silicon nitride (SiNx), but is not limited thereto.

A connection electrode 113a and a connection electrode 112a are formed on the third protection layer 102. The connection electrode 113a is connected to the first electrode 125 through a contact hole, and the connection electrode 112a is connected to the source electrode 134 of the transistor 130 through a contact hole.

Referring to FIG. 7, the display element 120 and the transistor 130 formed on the module substrate 101 are cut along the cutting line 140 to separate display modules 100-1 and 100-2 having at least one display element 120.

Next, a display device according to another embodiment is described with reference to FIG. 8 and FIG. 9.

Figure 8:
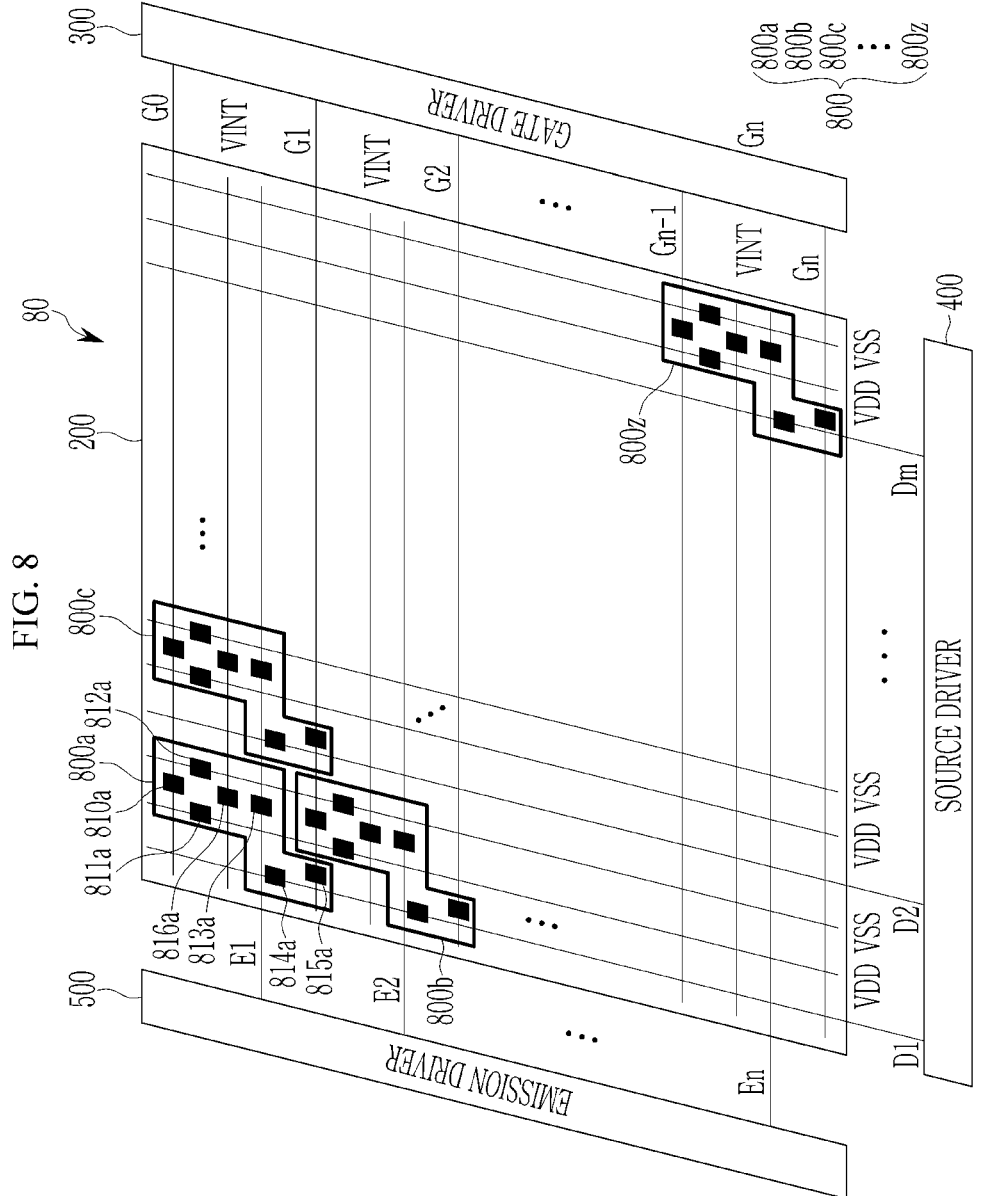
FIG. 8 is a block diagram schematically showing a display device according to another embodiment.

FIG. 8 is a block diagram schematically showing a display device according to another embodiment. As shown in FIG. 8, the display device 80 includes a plurality of display modules 800*a*, 800*b*, 800*c*, . . . , 800*z*, a substrate 200 on which a plurality of display modules 800*a*, 800*b*, 800*c*, . . . , 800*z* is positioned, and driving units 300, 400, and 500*a* for providing signals corresponding to a plurality of display modules 800*a*, 800*b*, 800*c*, . . . , 800*z*.

Each display module 800 includes a display element that emits light according to a signal from the driving units 300, 400, and 500. One display module 800 may have one or a plurality of display elements emitting light of one color wavelength. Also, the display modules 800*a* and 800*b* connected to the same gate line G1 may have a shape that is fitted with each other.

The signals from the driving units 300, 400, and 500 may be transmitted to each display module 800 through a plurality of connection electrodes 810*a*, 811*a*, 812*a*, 813*a*, 814*a*, 815*a*, and 816*a* of each display module 800. A plurality of connection electrodes 810*a*, 811*a*, 812*a*, 813*a*, 814*a*, 815*a*, and 816*a* are electrically connected to connection pads on the substrate 200.

The number of a plurality of connection electrodes 810*a*, 811*a*, 812*a*, 813*a*, 814*a*, 815*a*, and 816*a* is different according to the number of display elements included in each display module 800. For example, when seven types of signals (e.g., a current stage gate signal, a previous stage gate signal, a light emitting control signal, a data signal, an initialization voltage, a first power voltage, and a second power voltage) are applied to one display element, the display module 800 having one display element may have seven connection electrodes, and the display module 800 having four display elements may have 28 connection electrodes. A plurality of connection electrodes 810*a*, 811*a*, 812*a*, 813*a*, 814*a*, 815*a*, and 816*a* may be formed of a transparent material.

The display module 800 having a plurality of display elements may include a common connection electrode for receiving a signal commonly applied to each display element. For example, the display module 800 having four display elements in the form of 1×4 may have ten connection electrodes (four data signal connection electrodes, two gate signal connection electrodes, one light emitting control signal connection electrode, one initialization voltage connection electrode, one first power voltage connection electrode, and one second power voltage connection electrode).

The substrate 200 includes a plurality of signal lines. For example, the substrate 200 may include a plurality of gate lines G1, G2, . . . , Gn, a plurality of light emitting control lines E1, E2, . . . , En, and a plurality of data lines D1, D2, . . . , Dm. In addition, the substrate 200 includes an initialization voltage line VINT providing an initialization voltage and a power voltage line VDD, VSS providing a power voltage. A plurality of signal lines may be positioned on the substrate 200 in different layers or on the same layer.

A plurality of data lines D1, D2, . . . , Dm extend approximately in the column direction and are substantially parallel to each other. A plurality of gate lines G1, G2, . . . , Gn extend approximately in the row direction and are substantially parallel to each other.

The connection pad on the substrate 200 may be positioned on the surface of the substrate 800. The arrangement shape of the connection pads connected to one display element on the substrate 200 is the same. The connection pads on the substrate 200 are electrically connected to a plurality of signal lines.

The gate driving unit 300 is connected to each display module 800 through a plurality of gate lines G1, G2, . . . Gn. The gate driving unit 300 generates a plurality of gate signals according to the control signal and transmits them to a corresponding gate line among a plurality of gate lines.

The source driving unit 400 has a plurality of data lines D1, D2, . . . , connected to each display module 800 through Dm. The source driving unit 400 receives an image data signal, a control signal, etc., and transmits a data signal to the corresponding data line among a plurality of data lines D1, D2, . . . , Dm. The source driving unit 400 selects a grayscale voltage according to the image data signal and transmits it to a plurality of data lines as a data signal.

The source driving unit 400 samples and holds the image data signal, and transmits a plurality of data signals to each of a plurality of data lines D1, D2, . . . , Dm. For example, the source driving unit 400 may apply a data signal having a predetermined voltage range to a plurality of data lines D1, D2, . . . , Dm. by corresponds to a gate signal of an enable level, The light emitting control driving unit 500 is connected to each display module 800 through a plurality of light emitting control lines E1, E2, . . . , En. The light emitting control driving unit 500 generates a plurality of light emitting control signals according to the control signal and transmits them to a corresponding light emitting control line among a plurality of light emitting control lines.

In addition, at least one of the driving units 300, 400, and 500 may apply at least one of the initialization voltage, the first power voltage, and the second power voltage to the power voltage lines VDD and VSS. The first power voltage applied to the power voltage line VDD and the second power voltage applied to the power voltage line VSS may have different values.

The substrate 200 and the signal lines G1, G2, . . . , Gn, E1, E2, . . . , En, D1, D2, . . . , Dm, VINT, VDD, VSS, and the pads 810*a*, 811*a*, 812*a*, 813*a*, 814*a*, 815*a*, and 816*a* on the substrate are formed of a transparent material and a transparent electrode is also used for the display module 800, so that the display device 10 having high transmittance may be realized.

On the other hand, when the substrate 200 has stretchable, flexible, bendable and foldable properties, a curved display with high transmittance may be realized by mounting the display module 800 on the substrate 200. Alternatively, a curved display with high transmittance may be realized by attaching the substrate 200 to a curved glass substrate that is curved in a specific shape after mounting the display module 800 on the substrate 200. This curved display may be used as a front glass, rear glass, side mirror of a vehicle, glass of a building, or a mirror.

Figure 9:
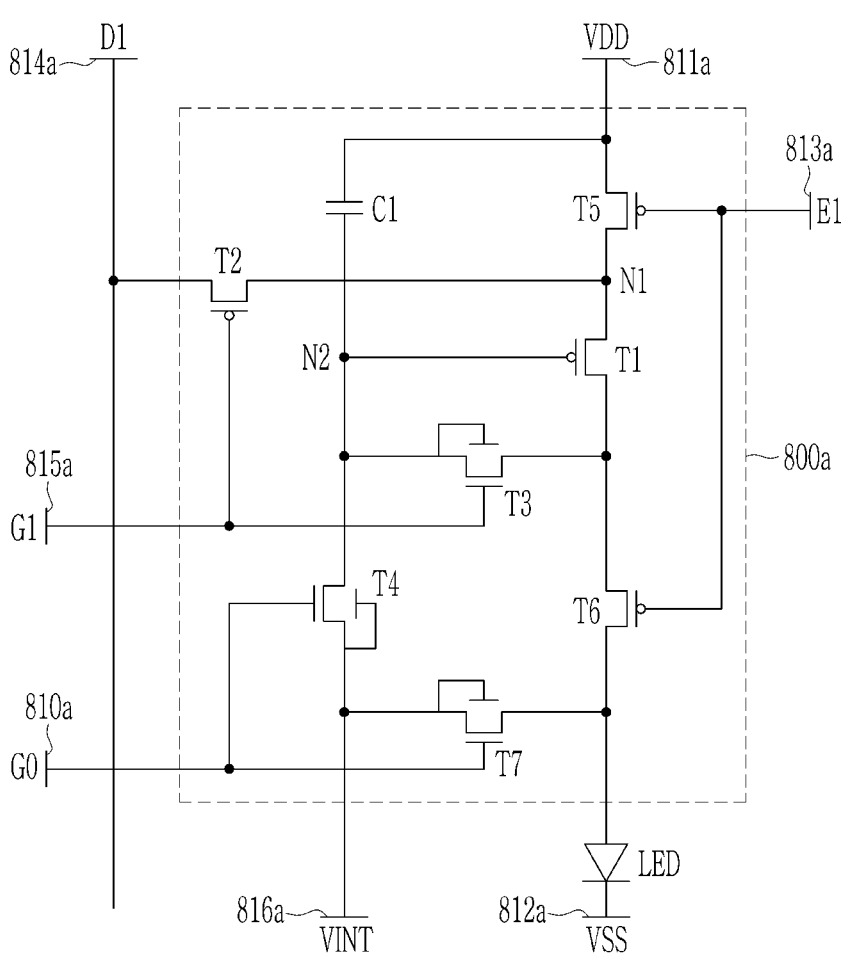
FIG. 9 is a circuit diagram showing an example of a display element of a display device according to another embodiment.

FIG. 9 is a circuit diagram showing an example of a display element of a display device according to another embodiment. The display module 800*a* will be described as an example.

Referring to FIG. 9, the display element includes first to seventh transistors T1 to T7, a storage capacitor C1, and a light emitting diode LED.

One terminal of the first transistor T1 is connected to the first node N1, and the other terminal is connected to one terminal of the sixth transistor T6. Also, the gate of the first transistor T1 is connected to the second node N2. The first transistor T1 may control the amount of the current supplied from the first power voltage to the second pixel power supply ELVSS via the organic light emitting diode OLED in response to the voltage stored in the storage capacitor C1. In order to secure a fast driving speed, the first transistor T1 may be formed of a polysilicon transistor. Also, the first transistor T1 may be formed of a P type transistor.

One terminal of the second transistor T2 is connected to the data line D1 through the connection electrode 814a, and the other terminal is connected to the first node N1. And, the gate of the second transistor T2 is connected to the current stage gate line G1 through the connection electrode 815a. The second transistor T2 is turned on when the enable level gate signal is supplied to the main gate line G1 to electrically connect the data line D1 and the first node N1.

The third transistor T3 is connected between the other terminal of the first transistor T1 and the second node N2. And, the gate of the third transistor T3 is connected to the current stage gate line G1 through the connection electrode 815a. This third transistor T3 is turned on when the gate signal is supplied to the current stage gate line G1, so that the first transistor T1 may be connect in a form of a diode.

The third transistor T3 may be formed of an oxide semiconductor transistor. In this case, the third transistor T3 may be formed of an N-type transistor. When the third transistor T3 is formed of an oxide semiconductor transistor, the leakage current flowing from the second node N2 to the other terminal of the first transistor T1 may be minimized, so that an image with a desired luminance may be displayed.

One terminal of the fourth transistor T4 is connected to the second node N2, and the other terminal is connected between the initialization voltage VINT through the connection electrode 816a. And, the gate of the fourth transistor T4 is connected to the previous stage gate line G0 through the connection electrode 810a. The fourth transistor T4 is turned on when the gate signal is supplied to the previous stage gate line G0, and the initialization voltage may be supplied to the second node N2.

The fourth transistor T4 may be formed of an oxide semiconductor transistor. In this case, the fourth transistor T4 may be formed of an N-type transistor. When the fourth transistor T4 is formed of an oxide semiconductor transistor, the leakage current flowing from the second node N2 to the initialization voltage VINT may be minimized, so that an image with a desired luminance may be displayed.

The seventh transistor T7 has one terminal connected to the initialization voltage VINT through connection electrode 816a, and the other terminal connected to the anode of the light emitting diode LED. Also, the gate of the seventh transistor T7 is connected to the previous stage gate line G0 through the connection electrode 810a. The seventh transistor T7 is turned on when the gate signal is supplied to the previous stage gate line G0, and it may supply the initialization voltage to the anode of the light emitting diode LED.

The seventh transistor T7 may be formed of an oxide semiconductor transistor. The seventh transistor T7 may be formed of an N-type transistor. If the seventh transistor T7 is formed of an oxide semiconductor transistor, the leakage current flowing from the anode of the light emitting diode LED to the initialization voltage VINT during the light emission period may be minimized.

Meanwhile, the initialization voltage may be set to a voltage lower than the data signal. When the initialization voltage is supplied to the anode of the light emitting diode LED, a parasitic capacitor of the light emitting diode LED is discharged.

The third, fourth, and seventh transistors T3, T4, and T5 may be a double gate transistor. The third, fourth, and seventh transistor T3, T4, and T5 may be double gate transistors. The double gate transistor is a transistor including an activation layer where a channel region is formed, a first gate electrode including at least a part overlapping the activation layer, a second gate electrode including at least a part overlapping the activation layer, and a source and a drain electrode connected to a source and drain region connected to the activation layer.

According to an example, the first gate electrode may at least partially overlap the channel region of the activation layer above the activation layer, and the second gate electrode may at least partially overlap the channel region of the activation layer below the activation layer. According to another example, the first gate electrode may at least partially overlap the channel region of the activation layer under the activation layer, and the second gate electrode may at least partially overlap the channel region of the activation layer above the activation layer.

The third transistor T3 may include a first gate electrode connected to the current stage gate line G1 and a second gate electrode connected to the second node N2. Since the second node N2 is connected to the source electrode of the third transistor T3, the third transistor T3 may be referred to as a source sink double gate transistor.

The fourth transistor T4 may include a first gate electrode connected to the second previous stage gate line G0 and a second gate electrode connected to an initialization voltage VINT. Since the initialization voltage VINT is connected to the source electrode of the fourth transistor T4, the fourth transistor T4 may be referred to as a source sink double gate transistor.

The seventh transistor T7 may include a first gate electrode connected to the previous stage gate line G0 and a second gate electrode connected to an initialization voltage VINT. Since the initialization voltage VINT is connected to the source electrode of the seventh transistor T7, the seventh transistor T7 may be referred to as a source sink double gate transistor.

Since the third, fourth, and seventh transistors T3, T4, and T5 have a double gate transistor structure, an element reliability may be increased.

One terminal of the fifth transistor T5 is connected to the first power voltage through the connection electrode 811a, and the other terminal is connected to the first node N1. And, the gate of the fifth transistor T5 is connected to the light emitting control line E1 through the connection electrode 813a. The fifth transistor T5 may be turned off when the light emitting control signal is supplied to the light emitting control line E1, and may be turned on when the light emitting control signal is not supplied.

The fifth transistor T5 may be formed of a polysilicon transistor. The fifth transistor T5 may be formed of a P-type transistor.

The sixth transistor T6 is connected between the other terminal of the first transistor T1 and the anode of the light emitting diode LED. And, the gate of the sixth transistor T6 is connected to the light emitting control line E1 through the connection electrode 813a. The sixth transistor T6 may be turned off when the light emitting control signal is supplied to the light emitting control line E1, and may be turned on when the light emitting control signal is not supplied.

The sixth transistor T6 may be formed of a polysilicon transistor. The sixth transistor T6 may be formed of a P-type transistor.

The storage capacitor C1 is connected between the first power voltage and the second node N2. The storage capacitor C1 may store the data signal and a voltage corresponding to the threshold voltage of the first transistor T1.

Meanwhile, in the above-described embodiment, by forming the second transistor T2, third transistor T3, fourth transistor T4, and fifth transistor T5 with the oxide semiconductor transistors, the leakage current may minimized, and accordingly, the pixel PXL may emit light with a normal luminance.

The cathode of the light emitting diode LED is connected to the power voltage line VSS through the connection electrode 812a. The light emitting diode LED receives the driving current from the first transistor T1 and emits light.

Since the display device according to an embodiment has the double gate transistor structure including the oxide semiconductor, it has a merit that it may provide a high-resolution display device with high reliability of each element, excellent display quality, and low power consumption.

The display device according to the exemplary embodiment uses an individual display module chip, so that it is possible to implement a large display with a size of several tens of meters, which cannot be currently implemented in display devices using OLED display elements.

Further, it was possible to implement a flexible display device using a subminature LED only in a passive matrix display form, but when the display module chip according to the present disclosure is used, it is possible to implement a flexible active matrix display using a subminiature LED. In addition, the display device according to an embodiment may be used in a front glass, a rear glass, a side mirror of a vehicle, a building glass, a mirror, and the like.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a substrate including a plurality of first pads for transmitting a gate signal, a plurality of second pad for transmitting a data signal, a plurality of third pads for transmitting a first power voltage, and a plurality of fourth pads for transmitting a second power voltage different from the first power voltage, in a display area; and
a plurality of display modules, each including first to fourth connection electrodes attached to the first to the fourth pads, respectively, a first transistor electrically connected to the third connection electrode and having an activation layer including an oxide semiconductor, a second transistor electrically connected to the first connection electrode and the second connection electrode, and a light emitting diode electrically connected to the first transistor and the fourth connection electrode.

2. The display device of claim 1, wherein:
the first transistor includes one terminal and a first gate that are connected to an anode of the light emitting diode, a second gate connected to the second transistor, and the other terminal connected to the third connection electrode.

3. The display device of claim 1, wherein:
the substrate further includes a plurality of gate lines and a plurality of second power voltage line extending in a first direction and arranged along a second direction crossing the first direction, and a plurality of data lines and a plurality of first power voltage lines extending in the second direction and arranged along the first direction,
a plurality of first pads is connected to a plurality of gate lines, a plurality of second pads is connected to a plurality of data lines, a plurality of third pads is connected to a plurality of first power voltage lines, and a plurality of fourth pads is connected to a plurality of second power voltage lines.

4. The display device of claim 3, wherein:
a plurality of gate lines and a plurality of second power voltage lines, and a plurality of data lines and a plurality of first power voltage lines are positioned on different layers from each other.

5. The display device of claim 1, wherein:
each of a plurality of display modules includes a substrate, a first conductive semiconductor layer on the substrate, a first activation layer on the first conductive semiconductor layer, a second conductive semiconductor layer on the first activation layer, a reflective layer on the second conductive semiconductor layer, a first protection layer covering the reflective layer, and a display element including one terminal connected to the first conductive semiconductor layer on the first protection layer and the other terminal connected to the reflective layer on the protection layer, the light emitting diode includes the first conductive semiconductor layer, the first activation layer, and the second conductive semiconductor layer, and
further includes a transistor including a first gate electrode on the first protection layer, a gate insulating layer on the first gate electrode, a second activation layer on the gate insulating layer, a source electrode and a drain electrode on the second activation layer, a second protection layer covering the source electrode and the drain electrode, and a second gate electrode on the second protection layer,
the first connection electrode is connected to the one terminal, the second connection electrode is connected to the drain electrode, and the other terminal is connected to the source electrode.

6. A display device comprising:
a display element including a substrate, a first conductive semiconductor layer on the substrate, a first activation layer on the first conductive semiconductor layer, a second conductive semiconductor layer on the first activation layer, a reflective layer on the second conductive semiconductor layer, a first protection layer covering the reflective layer, and one terminal connected to the first conductive semiconductor layer on the first protection layer and the other terminal connected to the reflective layer on the protection layer;
a transistor including a first gate electrode on the first protection layer, a gate insulating layer on the first gate electrode, a second activation layer including an oxide semiconductor on the gate insulating layer, a source electrode and a drain electrode on the second activation layer, a second protection layer covering the source electrode and the drain electrode, and a second gate electrode on the second protection layer; and
a first connection electrode connected to one terminal and a second connection electrode connected to the drain electrode,
wherein the other terminal is connected to the source electrode.

7. The display device of claim 6, wherein:
the first gate electrode or the second gate electrode is connected to the source electrode.

8. The display device of claim 6, wherein:
the first conductive semiconductor layer and the second conductive semiconductor layer is formed of III-V Group material.

9. The display device of claim 6, wherein:

the first activation layer is composed of III-V Group material.

10. The display device of claim 6, wherein:

at least at least one electrode of the one terminal, the other terminal, the first gate electrode, the source electrode, the drain electrode, the second gate electrode, the first connection electrode, and the second connection electrode includes at least one transparent material of ITO (Indium Tin Oxide), IZO (Indium Zinc Oxide), Ag nanowire.

* * * * *